United States Patent
Dong et al.

(10) Patent No.: US 11,961,547 B2
(45) Date of Patent: Apr. 16, 2024

(54) TECHNIQUES FOR MEMORY SYSTEM REFRESH

(71) Applicant: Micron Technology, Inc., Boise, ID (US)

(72) Inventors: Qi Dong, Shanghai (CN); Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 222 days.

(21) Appl. No.: 17/668,197

(22) Filed: Feb. 9, 2022

(65) Prior Publication Data

US 2023/0253024 A1   Aug. 10, 2023

(51) Int. Cl.
 G11C 7/00     (2006.01)
 G06F 11/07    (2006.01)
 G11C 11/406   (2006.01)

(52) U.S. Cl.
CPC ...... *G11C 11/40611* (2013.01); *G06F 11/076* (2013.01); *G06F 11/0772* (2013.01); *G11C 11/40622* (2013.01); *G11C 2211/4061* (2013.01)

(58) Field of Classification Search
CPC ......... G11C 11/40611; G11C 11/40622; G11C 11/4061; G06F 11/076; G06F 11/0772
See application file for complete search history.

(56) References Cited

U.S. PATENT DOCUMENTS

| | | | | |
|---|---|---|---|---|
| 8,996,824 | B2 * | 3/2015 | Brittain | G06F 13/1689 |
| | | | | 711/158 |
| 9,123,445 | B2 * | 9/2015 | Ellis | G06F 11/1048 |
| 9,123,448 | B2 * | 9/2015 | Sellier | G21F 9/30 |
| 9,483,370 | B2 * | 11/2016 | Reche | G11C 16/349 |
| 9,570,189 | B1 * | 2/2017 | Lee | G06F 11/1068 |
| 10,824,573 | B1 * | 11/2020 | Meier | G06F 21/79 |
| 11,748,276 | B2 * | 9/2023 | Meier | G06F 21/6218 |
| | | | | 711/164 |
| 2012/0066438 | A1 * | 3/2012 | Yoon | G06F 12/0246 |
| | | | | 711/171 |
| 2014/0089561 | A1 * | 3/2014 | Pangal | G06F 11/1012 |
| | | | | 711/103 |
| 2015/0318035 | A1 * | 11/2015 | Dong | G11C 11/40603 |
| | | | | 365/222 |
| 2019/0391916 | A1 * | 12/2019 | Hsieh | G06F 12/0292 |
| 2022/0391318 | A1 * | 12/2022 | Singh | G06F 12/0238 |

\* cited by examiner

*Primary Examiner* — Viet Q Nguyen
(74) *Attorney, Agent, or Firm* — Holland & Hart LLP

(57) ABSTRACT

Methods, systems, and devices for techniques for memory system refresh are described. In some cases, a memory system may prioritize refreshing blocks of memory cells containing control information for the file system of the memory system. For example, the memory system may identify a block of memory cells containing control information and adjust an error threshold for refreshing the blocks of memory cells to be lower than an error threshold for refreshing the blocks of memory cells containing data other than control information. Additionally or alternatively, the memory system may perform a refresh control operation for the block of memory cells with a higher frequency (e.g., more frequently) than for other blocks of memory cells.

25 Claims, 4 Drawing Sheets

TECHNIQUES FOR MEMORY SYSTEM REFRESH

FIELD OF TECHNOLOGY

The following relates to one or more systems for memory, including techniques for memory system refresh.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
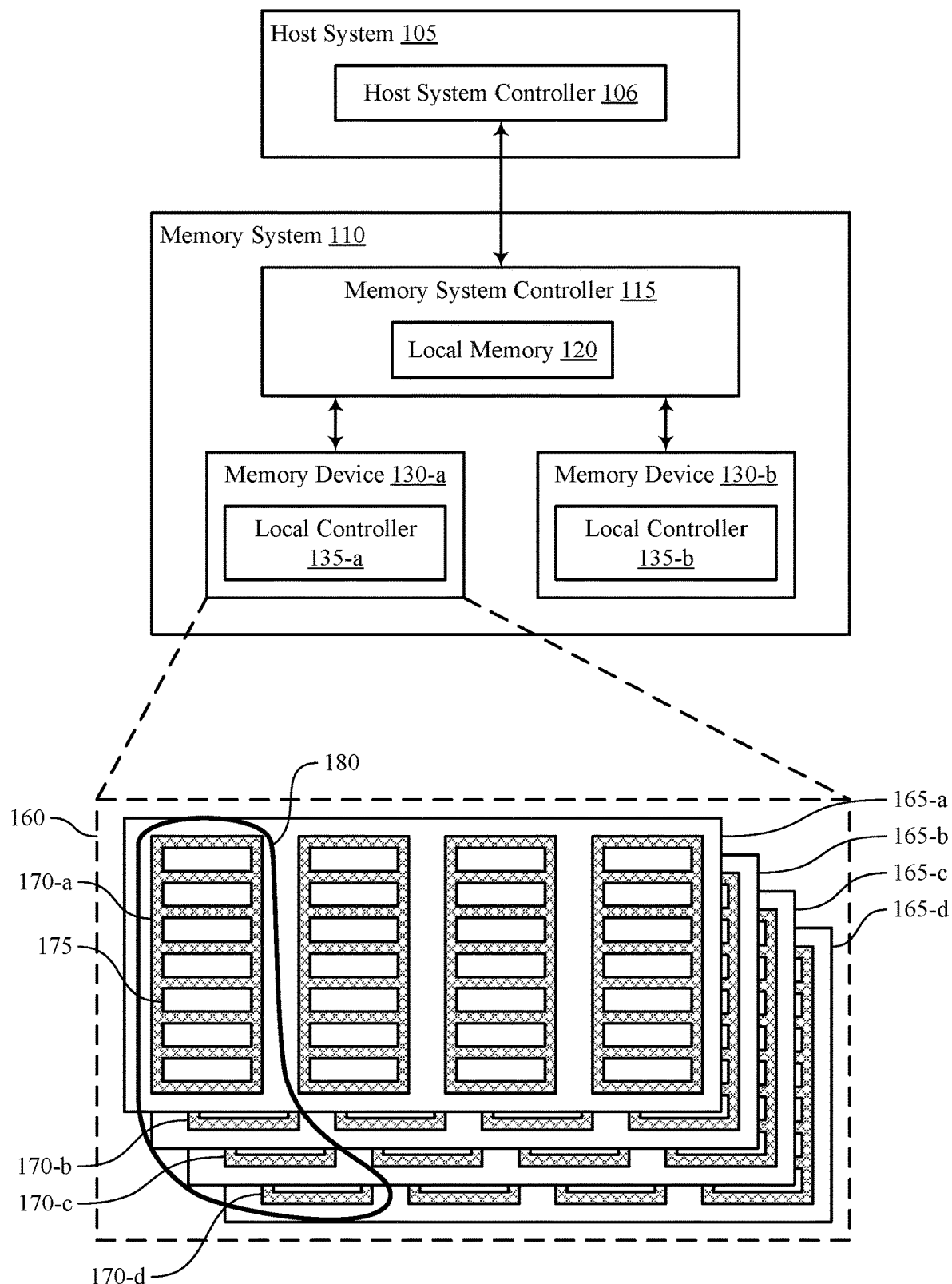
FIG. 1 illustrates an example of a system that supports techniques for memory system refresh in accordance with examples as disclosed herein.

Some memory systems may operate under various conditions as part of electronic apparatuses such as aerospace applications, personal computers, wireless communication devices, automobiles, etc. Memory systems supporting applications for some implementations (e.g., aerospace applications) may be subject to increased reliability constraints. As such, memory systems for some applications may be expected to operate with a reliability subject to relatively higher industry standards or specifications (e.g., higher reliability constraints). In some examples, a memory system may improve reliability of stored data using one or more algorithms to control, correct, or both errors which may be introduced into stored data over time. For example, the memory system may perform a refresh control operation, such as a data retention scan or data refresh algorithm, on one or more blocks of memory cells included in memory devices of the memory system. In some cases, the refresh control operation may include scanning blocks of memory cells of the memory system to determine whether a scanned block is at risk of losing data or becoming corrupted. For example, the memory system may perform an error control operation to detect a quantity of errors for a scanned block. If the quantity of detected errors in the scanned block is at or near an error threshold, such as a threshold quantity of errors which may be corrected using the error control operation, the memory system may determine that the scanned block is at risk of corruption. Accordingly, the memory system may schedule the scanned block to be refreshed (e.g., the information read, corrected, and written to a new block). In some cases, the memory system may scan each block of memory cells of the memory system and schedule any blocks determined to have a quantity of errors at or near the error threshold of the error control operation for refresh, such that the first (e.g., sequential first) block of memory cells scheduled may be refreshed first, the second block of memory cells scheduled may be refreshed after the first block of memory cells, and so on (e.g., using a first-in first-out approach).

Such refresh control operations may scan the memory system in a sequential manner. In such cases, the blocks of the memory system may be treated equally. Scans associated with refresh control operations may also be interrupted to perform operations requested by a host system or other background operations. As such, there may be longer delays between when a refresh control operation performs a first scan of a block and when a refresh control operation performs a second scan of the block. Such an approach may result in a loss of high priority data, such as control information for a file system of the memory system, which may lead to reduced reliability of data stored in the memory system.

As described herein, a memory system may prioritize refreshing blocks of memory cells containing control information for the file system of the memory system. For example, the memory system may identify a block of memory cells containing control information and adjust an error threshold for the blocks of memory cells to be lower than an error threshold for blocks of memory cells containing data other than control information (e.g., data associated with a host system). Accordingly, the blocks of memory cells may be refreshed relatively sooner than other blocks. Additionally or alternatively, the memory system may perform a refresh control operation for the block of memory cells with a higher frequency (e.g., more frequently) than for other blocks of memory cells. Accordingly, the memory system may increase the refresh priority of blocks of memory cells containing control information, which may increase the reliability of data stored in the memory system.

Features of the disclosure are initially described in the context of systems, devices, and circuits with reference to FIG. 1. Features of the disclosure are described in the context of a process flow with reference to FIG. 2. These and other features of the disclosure are further illustrated by and described in the context of an apparatus diagram and flowchart that relate to techniques for memory system refresh with reference to FIGS. 3-4.

FIG. 1 illustrates an example of a system 100 that supports techniques for memory system refresh in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

The system 100 may include any quantity of non-transitory computer readable media that support techniques for memory system refresh. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 100 may prioritize refreshing blocks of memory cells containing control information for the file system of the memory system 100. For example, the memory system 100 may identify a block of memory cells (e.g., a block 170) containing control information and adjust an error threshold for the block 170 to be lower than an error threshold for blocks of memory cells containing data other than control information (e.g., user data). Accordingly, the block 170 be refreshed relatively sooner than other blocks because the error threshold is lower than the error threshold for other blocks. Additionally or alternatively, the memory system 100 may perform a refresh control operation for the block 170 with a higher frequency (e.g., more frequently) than for other blocks of memory cells. Accordingly, the memory system 100 may increase the refresh priority of blocks of memory cells containing control information, which may increase the reliability of data stored in the memory system 100.

Figure 2:
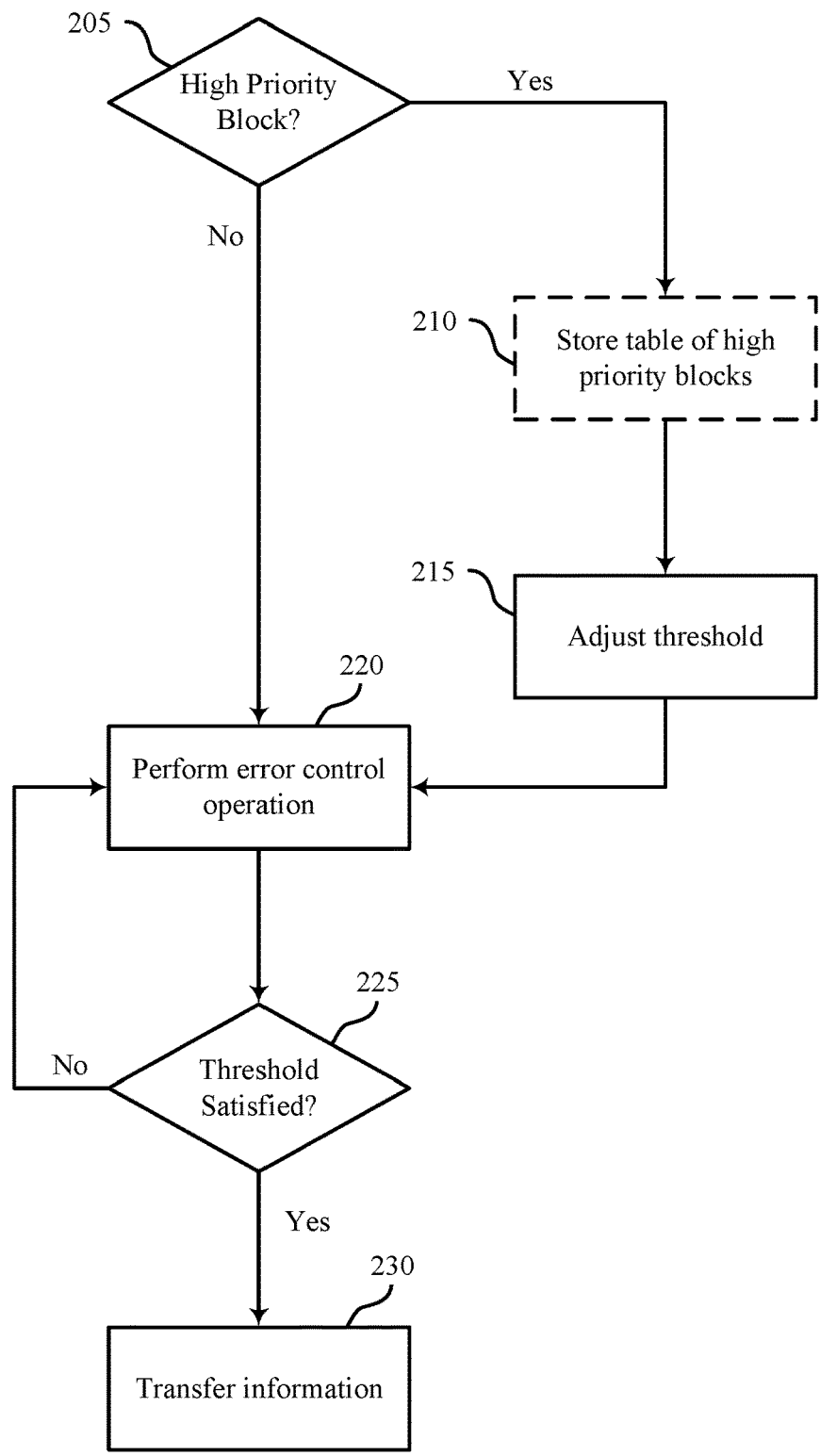
FIG. 2 illustrates an example of a process flow that supports techniques for memory system refresh in accordance with examples as disclosed herein.

FIG. 2 illustrates an example of a process flow 200 that supports techniques for memory system refresh in accordance with examples as disclosed herein. The process flow 200 may be implemented by a memory system, for example using a memory system controller, such as the memory system 110 and memory system controller 115 as described with reference to FIG. 1. In the following description of process flow 200, the operations may be performed in a different order than the order shown. For example, specific operations may also be left out of process flow 200, or other operations may be added to process flow 200.

In some examples, a memory system, such as a managed NAND (MNAND) system, an eMMC system, a UFS system, or an SSD, may improve reliability of stored data using one or more algorithms to control, correct, or both errors which may be introduced into stored data over time. For example, the memory system may perform a refresh control operation, such as a data retention scan or data refresh algorithm, on one or more blocks of memory cells included in memory devices of the memory system.

In some cases, the refresh control operation may include scanning blocks of memory cells of the memory system to determine whether a scanned block is at risk of losing data or becoming corrupted. For example, the memory system may perform an error control operation to detect a quantity of errors for a scanned block. The error control operation may use or be an example of a procedure to generate an error control code for a set of data and compare the generated error control code to a stored error control code. If the generated and the stored error control code match, the error control operation may determine that no error was detected in the data. Alternatively, if the generated and the stored error control code do not match, the error control operation may determine that one or more errors exists in the data. In some cases, the error control operation may be further configured to correct one or more of the detected errors (e.g., using the error control code). If the quantity of detected errors in the scanned block is at or near an error threshold, such as a threshold quantity of errors which may be corrected using the error control operation, the memory system may determine that the scanned block is at risk of corruption. Accordingly, the memory system may schedule the scanned block to be refreshed (e.g., the information read, corrected, and written to a new block).

In some cases, refreshing a first block of memory cells may include transferring data or other information stored in the block of memory cells to a second block of memory cells. For example, the memory system may read the read data from the first block of memory cells and write the data to the second block of memory cells. In some example, refreshing the first block of memory cells may include performing an error control operation to detect or correct (or both) a quantity of detected errors. As part of refreshing the first block of memory cells, the memory system may mark the first block of memory cells as free or available (e.g., so that new data may be stored in the first block of memory cells).

In some cases, the memory system may scan each block of memory cells of the memory system and schedule any blocks determined to have a quantity of errors at or near the error threshold of the error control operation for refresh, such that the first (e.g., sequential first) block of memory cells scheduled may be refreshed first, the second block of memory cells scheduled may be refreshed after the first block of memory cells, and so on (e.g., using a first-in first-out approach). In some examples, such a scan may sequentially go through every block in its set of blocks before rescanning blocks. Such a treatment for scanning could cause a longer latency between scans of a single block. If the time between scans becomes too long, the data stored in the block may become corrupted. Such an approach may result in a loss of high priority data, such as control information, for a file system of the memory system.

In some cases, a file system of memory system may include mapping or addressing information for files and data stored in the memory system. For example, the file system may include an indication of a file hierarchy or the L2P table of the memory system. In some cases, a file system may include control information to define and control settings or parameters of the file system. For example, the control information may include metadata for the file system, such as a superblock, which may include an indication of a file system type of the file system, a size of the file system, or both, a group descriptor, an inode bitmap, an inode table, or a combination thereof. In some examples, the memory system may store the control information the file system in one or more blocks of memory cells of the memory system Accordingly, if an unexpected power loss event occurs prior to refreshing a block of memory cells containing the control information, the control information may be lost or otherwise become unreliable, and the memory system may become unusable by a host.

Accordingly, as part of the refresh control operation, the memory system may perform one or more operations to safeguard blocks of memory cells containing high-priority information (e.g., control information for the file system) or other high priority data. For example, at 205, the memory system may determine whether a block of memory cells includes high-priority information (e.g., control information) for the file system.

In some cases, high-priority information (e.g., control information) may depend on the type of file system of the memory system. That is, different types of file systems (e.g., new technology file system (NTFS), file allocation table (FAT), extended FAT (exFAT), hierarchical file system (HFS), extended (EXT) file systems, among other examples) may use different protocols or may store high-priority information in different ways. Accordingly, to determine whether the block of memory cells includes high-priority information, the memory system may identify the type of the file system. In some cases, the memory system may retrieve the type of the file system using register bits. For example, a host system coupled with the memory system may store an indication of the type of the file system in a register, such as an extended card specific data (eCSD) register (e.g., if the memory system includes an eMMC device). Alternatively, the type or the file system may be stored in attributes (e.g., if the memory system includes a UFS device) or a log page (e.g., if the memory system includes an SSD). Additionally or alternatively, the memory system may determine the type of the file system by identifying a signature of data (e.g., a magic byte value) stored in the memory system characteristic of a file system type.

In some cases, based on determining that the block of memory cells includes high-priority information, the memory system may, at 210, store an indication of the location of the block of memory cells. For example, the memory system may store a high-priority information mapping (e.g., a control information mapping) for the physical addresses of blocks of memory cells that contain high-priority information (e.g., control information). In some cases, if the control information stored in the block of memory cells is transferred to a new block of memory cells (e.g., if the block of memory cells is refreshed, or if the high-priority information is transferred during garbage collection or wear-leveling procedures), the memory system may update the high-priority information mapping to reflect the new physical address of the high-priority information. Additionally or alternatively, the memory system may update the high-priority information mapping in response to receiving a command, such as a trim command, an erase command, or a write command, associated with logical addresses corresponding to the physical addresses of the high priority information.

In some examples, the memory system may experience an unexpected power loss while modifying the high-priority information mapping (e.g., while updating a physical address of high-priority information or adding an indication of a physical address for high-priority information). In such cases, the memory system may scrap any unfinished data and continue the unfinished refresh control operation (e.g., the memory system redetermine which blocks of memory cells include the high-priority information and rebuild the high-priority information mapping).

In some cases, based on determining that the block of memory cells includes high-priority information, the memory system may, at 215, adjust the error threshold for the block of memory cells (e.g., from a first threshold to a second threshold). For example, the memory system may reduce the error threshold to a value less than the quantity of errors which may be corrected using the error control operation. Additionally or alternatively, the memory system may reduce the error threshold for the block of memory cells to a value less than an error threshold for a block of memory cells containing data other than high-priority information (e.g., user data).

As part of the refresh control operation, the memory system may, at 220, perform the error control operation on the block of memory cells. In some cases, the error control operation may include generating an error control code using the high-priority information stored in the block of memory cells and comparing the generated error control code to a stored error control code (e.g., an error control code generated and stored prior to the refresh control operation, such as during the initial writing of the high-priority information). If the generated and the stored error control code match, the error control operation may determine that no error was detected in the data. Alternatively, if the generated and the stored error control code do not match, the error control operation may determine the quantity of errors that exist in the data.

Accordingly, at 225, the memory system may compare the quantity of detected errors to the error threshold (e.g., the error threshold adjusted at 215). If the quantity of errors satisfies the threshold, the memory system may determine that block of memory cells is at risk of corruption. Thus, at 230, the memory system may transfer the high-priority information, along with other data stored in the block of memory cells, from the block of memory cells to a second (e.g., a new) block of memory cells. In some cases, transferring the high-priority information from the block of memory cells to the second block of memory cells may include marking the block of memory cells or otherwise storing an indication that the block of memory cells is available. In some cases, transferring the high-priority information may include updating the physical address of the block of memory cells in the high-priority information mapping stored at 210.

Additionally or alternatively, the memory system may, at 225 determine that the quantity of detected errors in the block of memory cells does not satisfy the threshold. In such cases, the memory system may refrain from transferring the high-priority information to the second block of memory cells. In some cases, the memory system may continue to monitor the block of memory cells to determine whether the block of memory cells is at risk of corruption. For example, the memory system may adjust a periodicity for performing the refresh control operation on the block of memory cells from a first frequency to a second frequency.

That is, the memory system may perform the refresh control operation of process flow 200 for blocks of memory cells containing high-priority information (e.g., blocks of memory cells indicated in the high-priority information mapping stored at 210) at a higher frequency (e.g., more often) than blocks of memory cells containing data other than high-priority information (e.g., user data), such as by performing an independent refresh control operation for the blocks of memory cells included in the high-priority information mapping. Additionally or alternatively, the memory system may include blocks of memory cells storing user data along with the blocks of memory cells containing high-priority information in the refresh control operation, but may prioritize the blocks of memory cells containing high-priority information, such as by performing the error control operation and subsequent transfer of high-priority information on the blocks of memory cells containing high-priority information prior to servicing the blocks of memory cells containing user data.

In some cases, aspects of the process flow 200 may be performed in an idle stage or idle mode of the memory system, for example by combining aspects of the process flow 200 with a background scan of the memory system. In some cases, an idle mode may be a period of time in which the memory system may not be performing access commands or other commands received from a host system, for example because the host system may not have recently transmitted any commands or because the host system may be in an idle or standby mode.

The memory system may identify whether the block of memory cells contains high-priority information, modify the high-priority information mapping, adjust the error threshold of the block of memory cells, perform the error control operation on the block of memory cells, determine whether the quantity of errors satisfies the error threshold, transfer the high priority information, or any combination thereof during the idle mode. In some cases, performing aspects of the process flow 200 in the idle mode may improve system performance, for example by more efficiently utilizing system resources while in the idle mode (e.g., using otherwise dormant system resources) and thus allowing the memory system to devote more system resources to performing host system commands while not in the idle mode. If the host system is relatively demanding and keeps the memory system occupied for long periods of time, it may delay the refresh scans from occurring. In such cases, it may increase a time between scanning blocks, thereby allowing more errors to form in the block. In some examples, data may be corrupted while waiting for a refresh scan to complete. Thus, techniques for performing refresh scans may prioritize high-priority information to mitigate a likelihood of information becoming corrupted between scans.

Aspects of the process flow 200 may be implemented by a controller, among other components. Additionally or alternatively, aspects of the process flow 200 may be implemented as instructions stored in memory (e.g., firmware stored in a memory coupled with the memory system). For example, the instructions, when executed by a controller, may cause the controller to perform the operations of the process flow 200.

Figure 3:
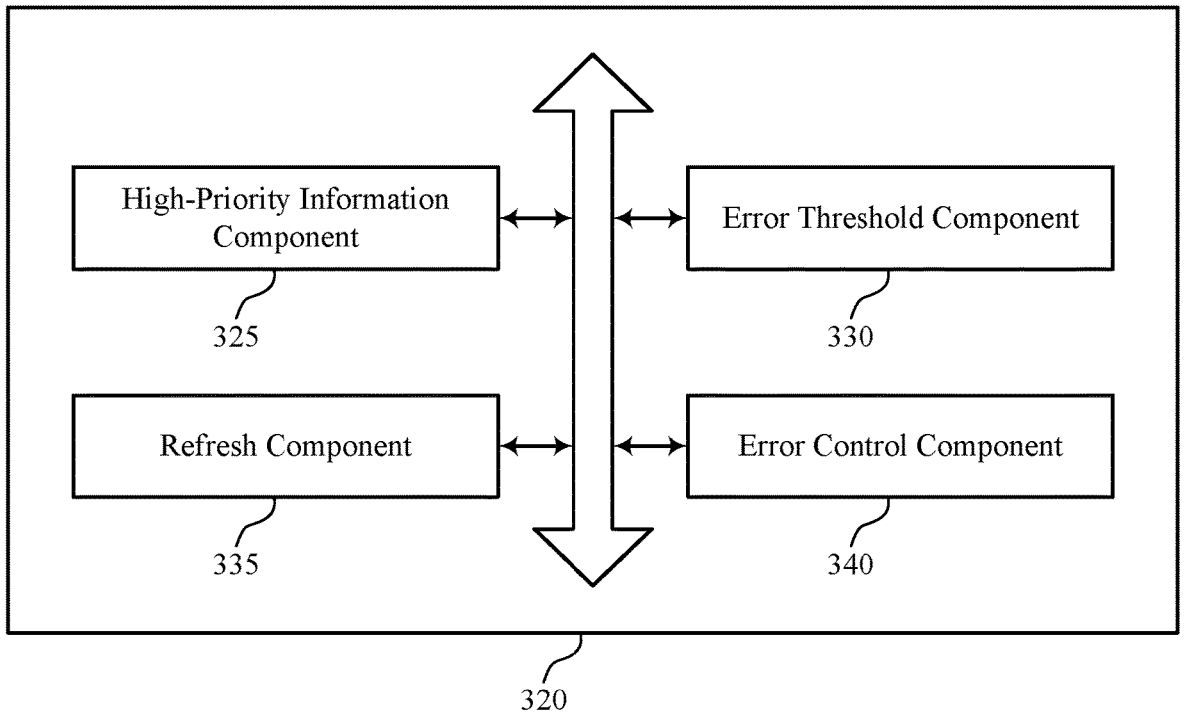
FIG. 3 shows a block diagram of a memory system that supports techniques for memory system refresh in accordance with examples as disclosed herein.

FIG. 3 shows a block diagram 300 of a memory system 320 that supports techniques for memory system refresh in accordance with examples as disclosed herein. The memory system 320 may be an example of aspects of a memory system as described with reference to FIGS. 1 through 2. The memory system 320, or various components thereof, may be an example of means for performing various aspects of techniques for memory system refresh as described herein. For example, the memory system 320 may include a high-priority information component 325, an error threshold component 330, a refresh component 335, an error control component 340, or any combination thereof. Each of these components may communicate, directly or indirectly, with one another (e.g., via one or more buses).

The high-priority information component 325 may be configured as or otherwise support a means for identifying whether a block of memory cells of a memory system includes high-priority information associated with a file system of the memory system. The error threshold component 330 may be configured as or otherwise support a means for adjusting a threshold associated with an error control operation of the block of memory cells from a first threshold to a second threshold based at least in part on identifying that the block of memory cells includes the high-priority information. The refresh component 335 may be configured as or otherwise support a means for performing a refresh control operation on the block of memory cells based at least in part on the second threshold.

In some examples, to support performing the refresh control operation, the error control component 340 may be configured as or otherwise support a means for performing the error control operation on the block of memory cells to determine a quantity of errors associated with logic states stored in the block of memory cells. In some examples, to support performing the refresh control operation, the error threshold component 330 may be configured as or otherwise support a means for determining whether the quantity of errors satisfies the second threshold based at least in part on performing the refresh control operation.

In some examples, the refresh component 335 may be configured as or otherwise support a means for transferring information stored in the block of memory cells to a second block of memory cells of the memory system based at least in part on determining that the quantity of errors satisfies the second threshold. In some examples, the refresh component 335 may be configured as or otherwise support a means for storing an indication that the block of memory cells is available.

In some examples, the refresh component 335 may be configured as or otherwise support a means for refraining from transferring information stored in the block of memory cells to a second block of memory cells of the memory system based at least in part on determining that the quantity of errors fails to satisfy the second threshold.

In some examples, the refresh component 335 may be configured as or otherwise support a means for adjusting a periodicity for performing the refresh control operation on the block of memory cells from a first frequency to a second frequency based at least in part on identifying that the block of memory cells includes the control information, where performing the refresh control operation is further based at least in part on the second frequency.

In some examples, the high-priority information component 325 may be configured as or otherwise support a means for identifying a type of the file system of the memory system, where identifying whether the block of memory cells includes the control information is based at least in part on identifying the type of the file system.

In some examples, the high-priority information component 325 may be configured as or otherwise support a means for storing an indication of a physical address of the block of memory cells in a mapping including blocks with the control information based at least in part on identifying that the block of memory cells includes the control information.

In some examples, the high-priority information component 325 may be configured as or otherwise support a means for updating the physical address of the block of memory cells in the mapping based at least in part on transferring information stored in the block of memory cells to a second block of memory cells.

In some examples, the control information includes metadata for the file system of the memory system.

In some examples, the metadata for the file system includes a superblock, a group descriptor, an inode bitmap, an inode table, or a combination thereof.

In some examples, the first threshold is associated with a first quantity of errors in the block of memory cells and the second threshold is associated with a second quantity of errors in the block of memory cells that is less than the first quantity of errors.

In some examples, the high-priority information component 325 may be configured as or otherwise support a means for identifying whether a block of memory cells of a memory system includes control information associated with a file system of the memory system. In some examples, the error threshold component 330 may be configured as or otherwise support a means for adjusting a threshold associated with an error control operation of the block of memory cells from a first threshold to a second threshold based at least in part on identifying that the block of memory cells includes the control information. In some examples, the refresh component 335 may be configured as or otherwise support a means for performing a refresh control operation on the block of memory cells based at least in part on the second threshold.

In some examples, to support performing the refresh control operation, the error control component 340 may be configured as or otherwise support a means for performing the error control operation on the block of memory cells to determine a quantity of errors associated with logic states stored in the block of memory cells. In some examples, to support performing the refresh control operation, the error threshold component 330 may be configured as or otherwise support a means for determining whether the quantity of errors satisfies the second threshold based at least in part on performing the refresh control operation.

In some examples, the refresh component 335 may be configured as or otherwise support a means for transfer information storing in the block of memory cells to a second block of memory cells of the memory system based at least in part on determining that the quantity of errors satisfies the second threshold. In some examples, the refresh component 335 may be configured as or otherwise support a means for storing an indication that the block of memory cells is available.

In some examples, the refresh component 335 may be configured as or otherwise support a means for refrain from transferring information stored in the block of memory cells to a second block of memory cells of the memory system based at least in part on determining that the quantity of errors fails to satisfy the second threshold.

In some examples, the refresh component 335 may be configured as or otherwise support a means for adjusting a periodicity for performing the refresh control operation on the block of memory cells from a first frequency to a second frequency based at least in part on identifying that the block of memory cells includes the control information, where performing the refresh control operation is further based at least in part on the second frequency.

Figure 4:
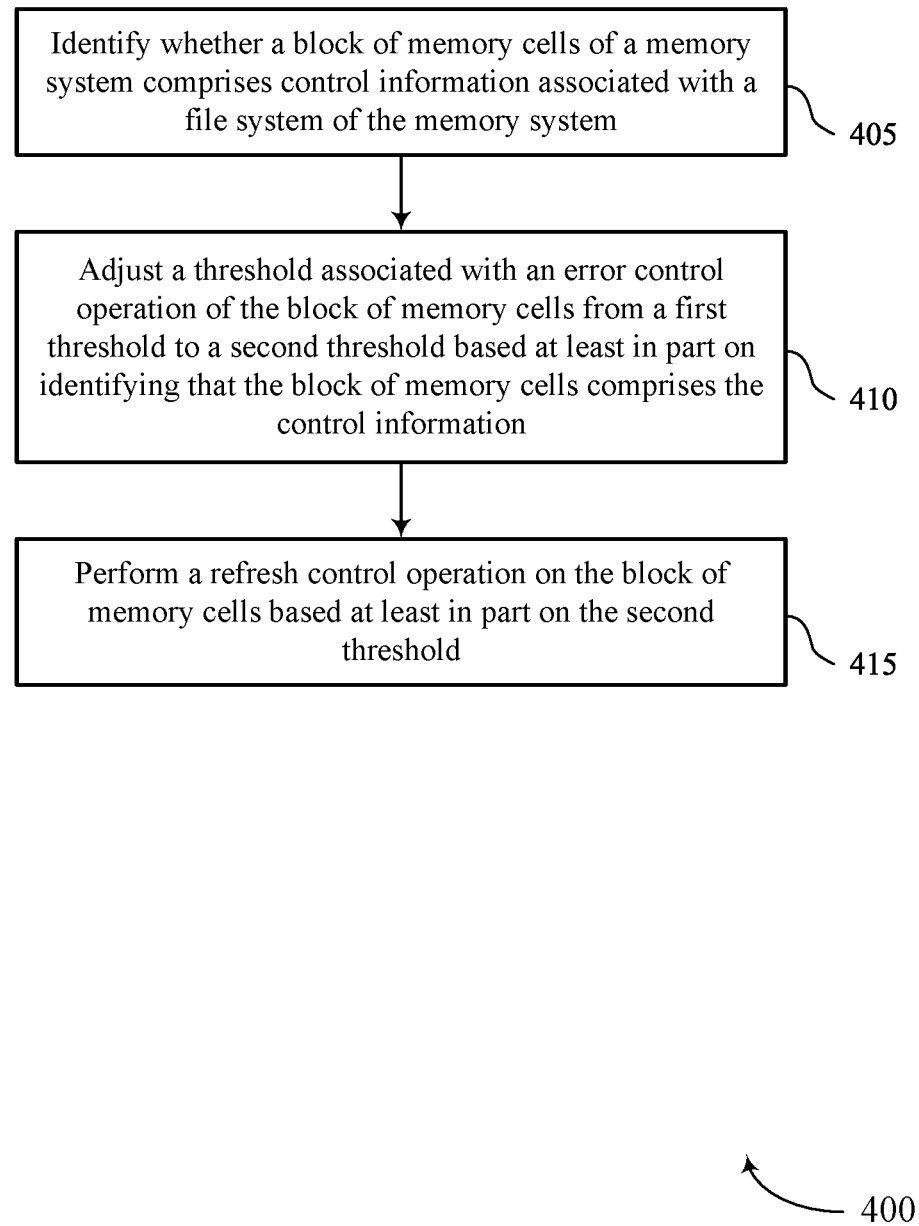
FIG. 4 shows a flowchart illustrating a method or methods that support techniques for memory system refresh in accordance with examples as disclosed herein.

FIG. 4 shows a flowchart illustrating a method 400 that supports techniques for memory system refresh in accordance with examples as disclosed herein. The operations of method 400 may be implemented by a memory system or its components as described herein. For example, the operations of method 400 may be performed by a memory system as described with reference to FIGS. 1 through 3. In some examples, a memory system may execute a set of instructions to control the functional elements of the device to perform the described functions. Additionally or alternatively, the memory system may perform aspects of the described functions using special-purpose hardware.

At 405, the method may include identifying whether a block of memory cells of a memory system includes control information associated with a file system of the memory system. The operations of 405 may be performed in accordance with examples as disclosed herein. In some examples, aspects of the operations of 405 may be performed by a high-priority information component 325 as described with reference to FIG. 3.

At 410, the method may include adjusting a threshold associated with an error control operation of the block of memory cells from a first threshold to a second threshold based at least in part on identifying that the block of memory cells includes the control information. The operations of 410 may be performed in accordance with examples as disclosed herein. In some examples, aspects of the operations of 410 may be performed by an error threshold component 330 as described with reference to FIG. 3.

At 415, the method may include performing a refresh control operation on the block of memory cells based at least in part on the second threshold. The operations of 415 may be performed in accordance with examples as disclosed herein. In some examples, aspects of the operations of 415 may be performed by a refresh component 335 as described with reference to FIG. 3.

In some examples, an apparatus as described herein may perform a method or methods, such as the method 400. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for identifying whether a block of memory cells of a memory system includes control information associated with a file system of the memory system; adjusting a threshold associated with an error control operation of the block of memory cells from a first threshold to a second threshold based at least in part on identifying that the block of memory cells includes the control information; and performing a refresh control operation on the block of memory cells based at least in part on the second threshold.

Aspect 2: The method, apparatus, or non-transitory computer-readable medium of aspect 1 where performing the refresh control operation includes operations, features, circuitry, logic, means, or instructions, or any combination thereof for performing the error control operation on the block of memory cells to determine a quantity of errors associated with logic states stored in the block of memory cells and determining whether the quantity of errors satisfies the second threshold based at least in part on performing the refresh control operation.

Aspect 3: The method, apparatus, or non-transitory computer-readable medium of aspect 2, further including operations, features, circuitry, logic, means, or instructions, or any combination thereof for transferring information stored in the block of memory cells to a second block of memory cells of the memory system based at least in part on determining that the quantity of errors satisfies the second threshold and storing an indication that the block of memory cells is available.

Aspect 4: The method, apparatus, or non-transitory computer-readable medium of any of aspects 2 through 3, further including operations, features, circuitry, logic, means, or instructions, or any combination thereof for refraining from transferring information stored in the block of memory cells to a second block of memory cells of the memory system based at least in part on determining that the quantity of errors fails to satisfy the second threshold.

Aspect 5: The method, apparatus, or non-transitory computer-readable medium of any of aspects 1 through 4, further including operations, features, circuitry, logic, means, or instructions, or any combination thereof for adjusting a periodicity for performing the refresh control operation on the block of memory cells from a first frequency to a second frequency based at least in part on identifying that the block of memory cells includes the control information, where performing the refresh control operation is further based at least in part on the second frequency.

Aspect 6: The method, apparatus, or non-transitory computer-readable medium of any of aspects 1 through 5, further including operations, features, circuitry, logic, means, or instructions, or any combination thereof for identifying a type of the file system of the memory system, where identifying whether the block of memory cells includes the control information is based at least in part on identifying the type of the file system.

Aspect 7: The method, apparatus, or non-transitory computer-readable medium of any of aspects 1 through 6, further including operations, features, circuitry, logic, means, or instructions, or any combination thereof for storing an indication of a physical address of the block of memory cells in a mapping including blocks with the control information based at least in part on identifying that the block of memory cells includes the control information.

Aspect 8: The method, apparatus, or non-transitory computer-readable medium of aspect 7, further including operations, features, circuitry, logic, means, or instructions, or any combination thereof for updating the physical address of the block of memory cells in the mapping based at least in part on transferring information stored in the block of memory cells to a second block of memory cells.

Aspect 9: The method, apparatus, or non-transitory computer-readable medium of any of aspects 1 through 8 where the control information includes metadata for the file system of the memory system.

Aspect 10: The method, apparatus, or non-transitory computer-readable medium of aspect 9 where the metadata for the file system includes a superblock, a group descriptor, an inode bitmap, an inode table, or a combination thereof.

Aspect 11: The method, apparatus, or non-transitory computer-readable medium of any of aspects 1 through 10 where the first threshold is associated with a first quantity of errors in the block of memory cells and the second threshold is associated with a second quantity of errors in the block of memory cells that is less than the first quantity of errors.

It should be noted that the methods described above describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 12: An apparatus, including: a controller associated with a memory device, where the controller is configured to cause the apparatus to: identify whether a block of memory cells of a memory system includes control information associated with a file system of the memory system; adjust a threshold associated with an error control operation of the block of memory cells from a first threshold to a second threshold based at least in part on identifying that the block of memory cells includes the control information; and perform a refresh control operation on the block of memory cells based at least in part on the second threshold.

Aspect 13: The apparatus of aspect 12, where performing the refresh control operation is configured to cause the apparatus to: perform the error control operation on the block of memory cells to determine a quantity of errors associated with logic states stored in the block of memory cells; and determine whether the quantity of errors satisfies the second threshold based at least in part on performing the refresh control operation.

Aspect 14: The apparatus of aspect 13, where the controller is further configured to cause the apparatus to: transfer information stored in the block of memory cells to a second block of memory cells of the memory system based at least in part on determining that the quantity of errors satisfies the second threshold; and store an indication that the block of memory cells is available.

Aspect 15: The apparatus of any of aspects 13 through 14, where the controller is further configured to cause the apparatus to: refrain from transferring information stored in the block of memory cells to a second block of memory cells of the memory system based at least in part on determining that the quantity of errors fails to satisfy the second threshold.

Aspect 16: The apparatus of any of aspects 12 through 15, where the controller is further configured to cause the apparatus to: adjust a periodicity for performing the refresh control operation on the block of memory cells from a first frequency to a second frequency based at least in part on identifying that the block of memory cells includes the control information, where performing the refresh control operation is further based at least in part on the second frequency.

Aspect 17: The apparatus of any of aspects 12 through 16, where the controller is further configured to cause the apparatus to: identify a type of the file system of the memory system, where identifying whether the block of memory cells includes the control information is based at least in part on identifying the type of the file system.

Aspect 18: The apparatus of any of aspects 12 through 17, where the controller is further configured to cause the apparatus to: store an indication of a physical address of the block of memory cells in a mapping including blocks with the control information based at least in part on identifying that the block of memory cells includes the control information.

Aspect 19: The apparatus of aspect 18, where the controller is further configured to cause the apparatus to: update the physical address of the block of memory cells in the mapping based at least in part on transferring information stored in the block of memory cells to a second block of memory cells.

Aspect 20: The apparatus of any of aspects 12 through 19, where the control information includes metadata for the file system of the memory system.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   identifying whether a block of memory cells of a memory system comprises control information associated with a file system of the memory system;
   adjusting a threshold associated with an error control operation of the block of memory cells from a first threshold to a second threshold based at least in part on identifying that the block of memory cells comprises the control information; and
   performing a refresh control operation on the block of memory cells based at least in part on the second threshold.

2. The method of claim 1, wherein performing the refresh control operation comprises:
   performing the error control operation on the block of memory cells to determine a quantity of errors associated with logic states stored in the block of memory cells; and
   determining whether the quantity of errors satisfies the second threshold based at least in part on performing the refresh control operation.

3. The method of claim 2, further comprising:
   transferring information stored in the block of memory cells to a second block of memory cells of the memory system based at least in part on determining that the quantity of errors satisfies the second threshold; and
   storing an indication that the block of memory cells is available.

4. The method of claim 2, further comprising:
   refraining from transferring information stored in the block of memory cells to a second block of memory cells of the memory system based at least in part on determining that the quantity of errors fails to satisfy the second threshold.

5. The method of claim 1, further comprising:
   adjusting a periodicity for performing the refresh control operation on the block of memory cells from a first frequency to a second frequency based at least in part on identifying that the block of memory cells comprises the control information, wherein performing the refresh control operation is further based at least in part on the second frequency.

6. The method of claim 1, further comprising:
   identifying a type of the file system of the memory system, wherein identifying whether the block of memory cells comprises the control information is based at least in part on identifying the type of the file system.

7. The method of claim 1, further comprising:
storing an indication of a physical address of the block of memory cells in a mapping comprising blocks with the control information based at least in part on identifying that the block of memory cells comprises the control information.

8. The method of claim 7, further comprising:
updating the physical address of the block of memory cells in the mapping based at least in part on transferring information stored in the block of memory cells to a second block of memory cells.

9. The method of claim 1, wherein the control information comprises metadata for the file system of the memory system.

10. The method of claim 9, wherein the metadata for the file system comprises a superblock, a group descriptor, an inode bitmap, an inode table, or a combination thereof.

11. The method of claim 1, wherein the first threshold is associated with a first quantity of errors in the block of memory cells and the second threshold is associated with a second quantity of errors in the block of memory cells that is less than the first quantity of errors.

12. A memory system, comprising:
processing circuitry associated with one or more memory devices, wherein the processing circuitry is configured to cause the memory system to:
identify whether a block of memory cells of the memory system comprises control information associated with a file system of the memory system;
adjust a threshold associated with an error control operation of the block of memory cells from a first threshold to a second threshold based at least in part on identifying that the block of memory cells comprises the control information; and
perform a refresh control operation on the block of memory cells based at least in part on the second threshold.

13. The memory system of claim 12, wherein performing the refresh control operation is configured to cause the memory system to:
perform the error control operation on the block of memory cells to determine a quantity of errors associated with logic states stored in the block of memory cells; and
determine whether the quantity of errors satisfies the second threshold based at least in part on performing the refresh control operation.

14. The memory system of claim 13, wherein the processing circuitry is further configured to cause the memory system to:
transfer information stored in the block of memory cells to a second block of memory cells of the memory system based at least in part on determining that the quantity of errors satisfies the second threshold; and
store an indication that the block of memory cells is available.

15. The memory system of claim 13, wherein the processing circuitry is further configured to cause the memory system to:
refrain from transferring information stored in the block of memory cells to a second block of memory cells of the memory system based at least in part on determining that the quantity of errors fails to satisfy the second threshold.

16. The memory system of claim 12, wherein the processing circuitry is further configured to cause the memory system to:
adjust a periodicity for performing the refresh control operation on the block of memory cells from a first frequency to a second frequency based at least in part on identifying that the block of memory cells comprises the control information, wherein performing the refresh control operation is further based at least in part on the second frequency.

17. The memory system of claim 12, wherein the processing circuitry is further configured to cause the memory system to:
identify a type of the file system of the memory system, wherein identifying whether the block of memory cells comprises the control information is based at least in part on identifying the type of the file system.

18. The memory system of claim 12, wherein the processing circuitry is further configured to cause the memory system to:
store an indication of a physical address of the block of memory cells in a mapping comprising blocks with the control information based at least in part on identifying that the block of memory cells comprises the control information.

19. The memory system of claim 18, wherein the processing circuitry is further configured to cause the memory system to:
update the physical address of the block of memory cells in the mapping based at least in part on transferring information stored in the block of memory cells to a second block of memory cells.

20. The memory system of claim 12, wherein the control information comprises metadata for the file system of the memory system.

21. A non-transitory computer-readable medium storing code, the code comprising instructions executable by a processor to:
identify whether a block of memory cells of a memory system comprises control information associated with a file system of the memory system;
adjust a threshold associated with an error control operation of the block of memory cells from a first threshold to a second threshold based at least in part on identifying that the block of memory cells comprises the control information; and
perform a refresh control operation on the block of memory cells based at least in part on the second threshold.

22. The non-transitory computer-readable medium of claim 21, wherein the instructions to perform the refresh control operation are executable by the processor to:
perform the error control operation on the block of memory cells to determine a quantity of errors associated with logic states stored in the block of memory cells; and
determine whether the quantity of errors satisfies the second threshold based at least in part on performing the refresh control operation.

23. The non-transitory computer-readable medium of claim 22, wherein the instructions are further executable by the processor to:
transfer information stored in the block of memory cells to a second block of memory cells of the memory system based at least in part on determining that the quantity of errors satisfies the second threshold; and store an indication that the block of memory cells is available.

24. The non-transitory computer-readable medium of claim 22, wherein the instructions are further executable by the processor to:
refrain from transferring information stored in the block of memory cells to a second block of memory cells of the memory system based at least in part on determining that the quantity of errors fails to satisfy the second threshold.

25. The non-transitory computer-readable medium of claim 21, wherein the instructions are further executable by the processor to:
adjust a periodicity for performing the refresh control operation on the block of memory cells from a first frequency to a second frequency based at least in part on identifying that the block of memory cells comprises the control information, wherein performing the refresh control operation is further based at least in part on the second frequency.

* * * * *